(12) United States Patent
Kawamura

(10) Patent No.: US 7,872,917 B2
(45) Date of Patent: Jan. 18, 2011

(54) NON-VOLATILE SEMICONDUCTOR MEMORY DEVICE AND MEMORY SYSTEM INCLUDING THE SAME

(75) Inventor: Shoichi Kawamura, Yokohama (JP)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 96 days.

(21) Appl. No.: 12/335,956

(22) Filed: Dec. 16, 2008

(65) Prior Publication Data
US 2009/0180319 A1 Jul. 16, 2009

(30) Foreign Application Priority Data
Dec. 25, 2007 (JP) ............................. 2007-332365
Dec. 15, 2008 (KR) ............................. 2008-127432

(51) Int. Cl.
*G11C 16/06* (2006.01)
*G11C 16/04* (2006.01)

(52) U.S. Cl. ............................. 365/185.2; 365/185.09; 365/185.27; 365/185.29; 365/185.33

(58) Field of Classification Search ............... 365/185.2
See application file for complete search history.

(56) References Cited

U.S. PATENT DOCUMENTS

| | | | | |
|---|---|---|---|---|
| 4,977,542 A | * | 12/1990 | Matsuda et al. | 365/207 |
| 6,344,994 B1 | * | 2/2002 | Hamilton et al. | 365/185.05 |
| 6,987,696 B1 | * | 1/2006 | Wang et al. | 365/185.29 |
| 7,248,500 B2 | * | 7/2007 | Tamada et al. | 365/185.2 |
| 7,301,815 B2 | * | 11/2007 | Kurata et al. | 365/185.2 |
| 7,417,895 B2 | * | 8/2008 | Cho | 365/185.17 |
| 7,643,345 B2 | * | 1/2010 | Ishibashi | 365/185.13 |
| 7,652,931 B2 | * | 1/2010 | Park et al. | 365/185.29 |
| 2005/0007822 A1 | * | 1/2005 | Lee et al. | 365/185.11 |
| 2009/0003047 A1 | * | 1/2009 | Toda | 365/163 |
| 2009/0040824 A1 | * | 2/2009 | Iizuka | 365/185.05 |

FOREIGN PATENT DOCUMENTS

KR 11086576 3/1999

* cited by examiner

*Primary Examiner*—Son L Mai
(74) *Attorney, Agent, or Firm*—Volentine & Whitt, PLLC

(57) ABSTRACT

Provided is a non-volatile semiconductor device. The non-volatile semiconductor memory devices including: first and second word line groups disposed in parallel; dummy word lines disposed between the first and second word line groups; a first bit line group intersecting the first word line group; and a second bit line group intersecting the second word line group, wherein the first and second word line groups, the first and second bit line groups, and the dummy word lines are disposed on a same well.

9 Claims, 8 Drawing Sheets though typical sector capacity is 0.5 Mbits, products having a sector capacity of 2 Mbits are developed and extensively used. This is because a multi-level cell (MLC) is applied to a semiconductor device and its chip size is miniaturized.

US 7,872,917 B2

NON-VOLATILE SEMICONDUCTOR MEMORY DEVICE AND MEMORY SYSTEM INCLUDING THE SAME

CROSS-REFERENCE TO RELATED APPLICATIONS

This U.S. non-provisional patent application claims priority under 35 U.S.C. §119 of Japanese Patent Application No. 2007-332365, filed on Dec. 25, 2007 and Korea Patent Application No. 2008-127432 filed on Dec. 15, 2008, the entire contents of which are hereby incorporated by reference.

BACKGROUND OF THE INVENTION

The present invention disclosed herein relates to a non-volatile semiconductor device, and more particularly, to a memory cell array of a flash memory.

Recently, demands for increasing a capacity of an erase sector (hereinafter, referred to as a sector) have been increased. Although typical sector capacity is 0.5 Mbits, products having a sector capacity of 2 Mbits are developed and extensively used. This is because a multi-level cell (MLC) is applied to a semiconductor device and its chip size is miniaturized.

If a memory having the same capacity as the MLC is realized with a single-level cell (SLC) technique, there are diverse methods as follows.

First, a method is provided for multiplying the typical number of bit lines in a memory cell array by four times.

Second, a method is provided for multiplying the typical number of word lines in a memory cell array by four times.

Third, a method is provided for multiplying the typical number of bit lines and the typical number of word lines in a memory cell array by two times, respectively.

Fourth, a method is provided for using four typical sectors to resemble one sector.

FIGS. 3 through 6 are plan views illustrating one to fourth methods. FIG. 3 illustrates a plan view when the first method is used. Compared to a memory cell array of 0.5 Mbits of FIG. 2 including 512 word lines and 1024 bit lines in a P well region 11, the memory cell array of FIG. 3 includes 4096 bit lines which are four times of the 1024 bit lines of FIG. 2. Additionally, FIG. 4 illustrates a plan view when the second method is used. Compared to the memory cell array of FIG. 2, the memory cell array of FIG. 4 includes 2048 word lines which are four times of the 512 word lines of FIG. 2. FIG. 5 illustrates a plan view when the third method is used. Compared to the memory cell array of FIG. 2, the memory cell array of FIG. 5 includes 1024 word lines and 2048 bit lines, which are two times of the 512 word lines and the 1024 bit lines of FIG. 2, respectively. FIG. 6 illustrates a view when the fourth method is used. The memory cell array of FIG. 6 uses four memory cell arrays (i.e., four sectors) of FIG. 2 as one memory cell array (i.e., one sector). The techniques related to the above methods are disclosed in Japanese Patent No. 3570879.

However, if the above methods are used, there are several difficulties as follows.

In a first case, if the length of a word line is four times that of a typical word line, even if word line drivers are disposed at both ends of a word line and driven, a time needed for a word line to reach a predetermined time is two times that of a typical method. Therefore, it is difficult to make a reading speed fast and thus it may become slower.

In a second case, if the length of a bit line is four times that of a typical bit line, it may affect a reading speed. Additionally, during an input operation of a memory cell, because of a bit line resistance, an actual voltage applied to a drain of a memory cell is lowered, and input characteristics in a sector are deteriorated. Additionally, the number of memory cells connected to a bit line is four times that of typical memory cells. Accordingly, when considering a cycling characteristics of a sector, drain disturb in a memory cell becomes four times typical drain disturb, and thus, it may be hard to obtain reliability.

In a third case, even though it is less disadvantageous than the first and second cases, the same limitations occur. In an aspect of a word line, time increase may be allowable or word line drivers may be disposed at both ends of the word line in order to be identical to the typical word line. However, in an aspect of cycling, drain disturb still remains.

In a fourth case, although characteristics are the same as typical characteristics, an area between sectors is needed more in terms of a layout. Therefore, this situation is unfavorable.

SUMMARY OF THE INVENTION

The present invention provides a non-volatile semiconductor memory device having various advantages. They are as follows. A time for receiving drain disturb is the same as before. It is useful in terms of a layout. A sector capacity is variable while maintaining a chip capacity.

Embodiments of the present invention provide non-volatile semiconductor memory devices including: first and second word line groups disposed in parallel; dummy word lines disposed between the first and second word line groups; a first bit line group intersecting the first word line group; and a second bit line group intersecting the second word line group, wherein the first and second word line groups, the first and second bit line groups, and the dummy word lines are disposed on a same well.

In some embodiments, the dummy word lines are disposed between the first and second bit line groups.

In other embodiments, during an erase operation, the same voltage applied to the first and second word line groups is applied to dummy word lines adjacent to the first and second word line groups among the dummy word lines.

In other embodiments, during an erase operation, dummy word lines are disposed to have predetermined distance from the first and second word line groups among the dummy word lines are biased so that memory cells connected to the dummy word lines disposed to have predetermined distance from the first and second word line groups are not to be erased In still other embodiments, memory cells connected to the first and second word line groups and the first and second bit line groups are able to constitute one erase sector.

In even other embodiments, memory cells connected to the first word line group and the first bit line group are able to constitute one erase sector, and memory cells connected to the second word line group and the second bit line group are able to constitute another one erase sector.

In yet other embodiments, memory systems include: the non-volatile semiconductor memory device; and a controller controlling the non-volatile semiconductor memory device.

In further embodiments, non-volatile semiconductor memory devices include: one well region used for forming a memory cell array; a plurality of dummy word lines disposed at a middle portion in one direction of the well region; a first word line group disposed at a first region in one direction side among the well regions at both sides of the dummy word lines; a second word line group disposed at a second region in the other side among the well regions at both sides of the dummy word lines; and a plurality of bit lines intersecting the first and second word line groups and the dummy word lines. The bit lines intersect the first word line group in the first region of the well region to constitute a first bit line group through being divided at a portion of the dummy word lines and the bit lines intersect the second word line group in the second region of the well region to constitute a second bit line group through being divided at a portion of the dummy word lines.

In still further embodiments, the number of the dummy word lines is four.

In even further embodiments, an erasing operation of the memory cell is performed by using the entire well region as a unit or the first or second region of the well region as a unit.

BRIEF DESCRIPTION OF THE FIGURES

The accompanying figures are included to provide a further understanding of the present invention, and are incorporated in and constitute a part of this specification. The drawings illustrate exemplary embodiments of the present invention and, together with the description, serve to explain principles of the present invention. In the figures.

DETAILED DESCRIPTION OF PREFERRED EMBODIMENTS

Preferred embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

Figure 1:
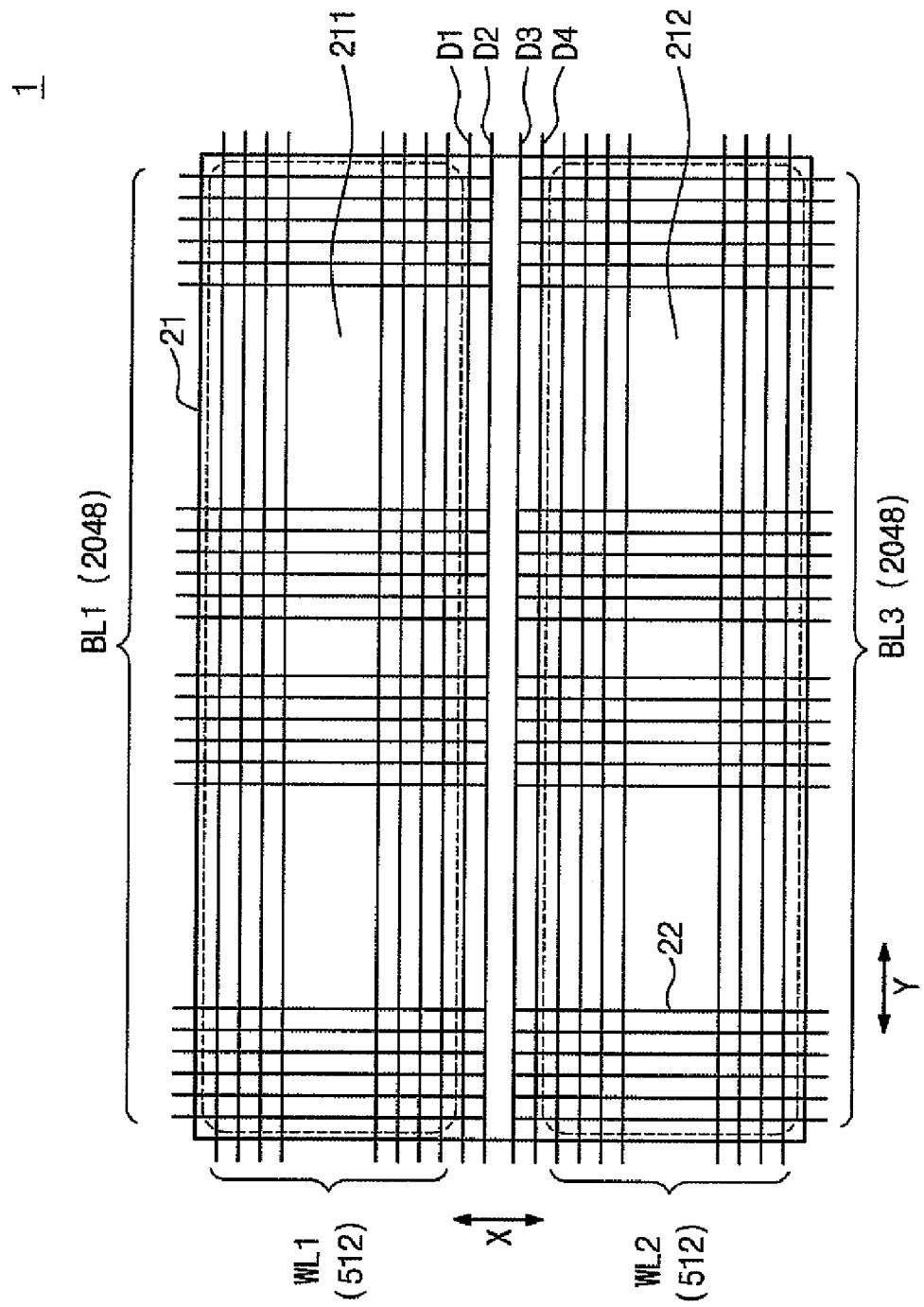
FIG. 1 is used for describing a non-volatile semiconductor memory device according to an embodiment of the present invention and is a plan view illustrating a memory cell array structure of a flash memory.
Figure 2:
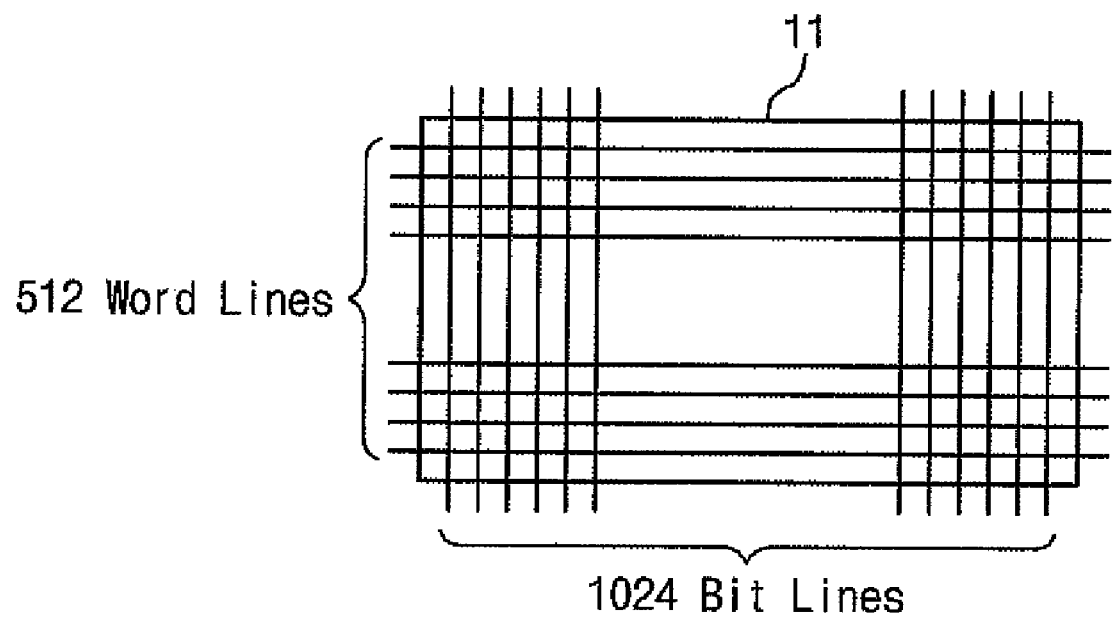
FIG. 2 is a plan view illustrating a memory cell array structure of 0.5 Mbits.
Figure 3:
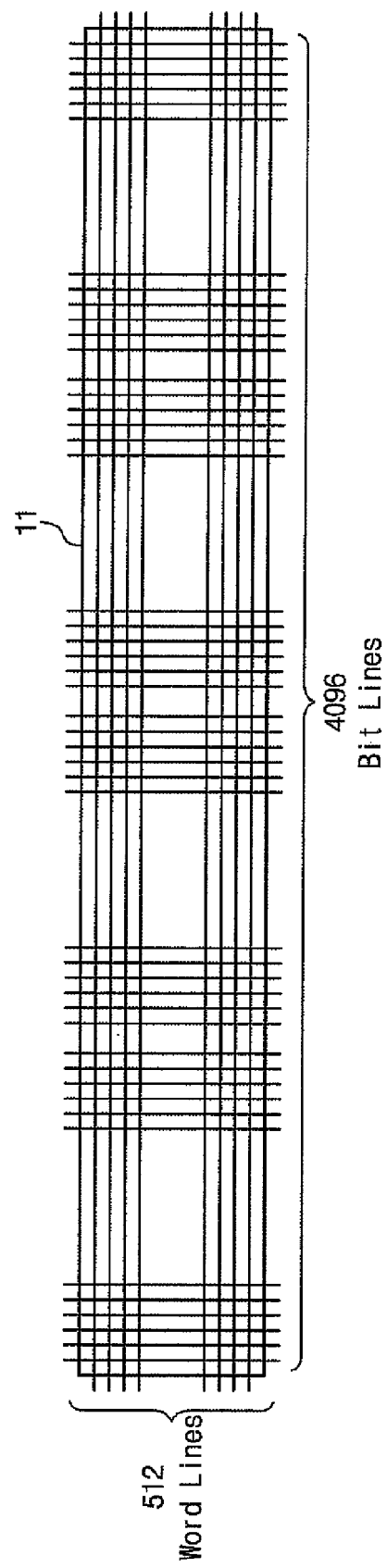
FIG. 3 is a plan view illustrating a memory cell array structure of 2 Mbits according to a first method through an SLC technique.
Figure 4:
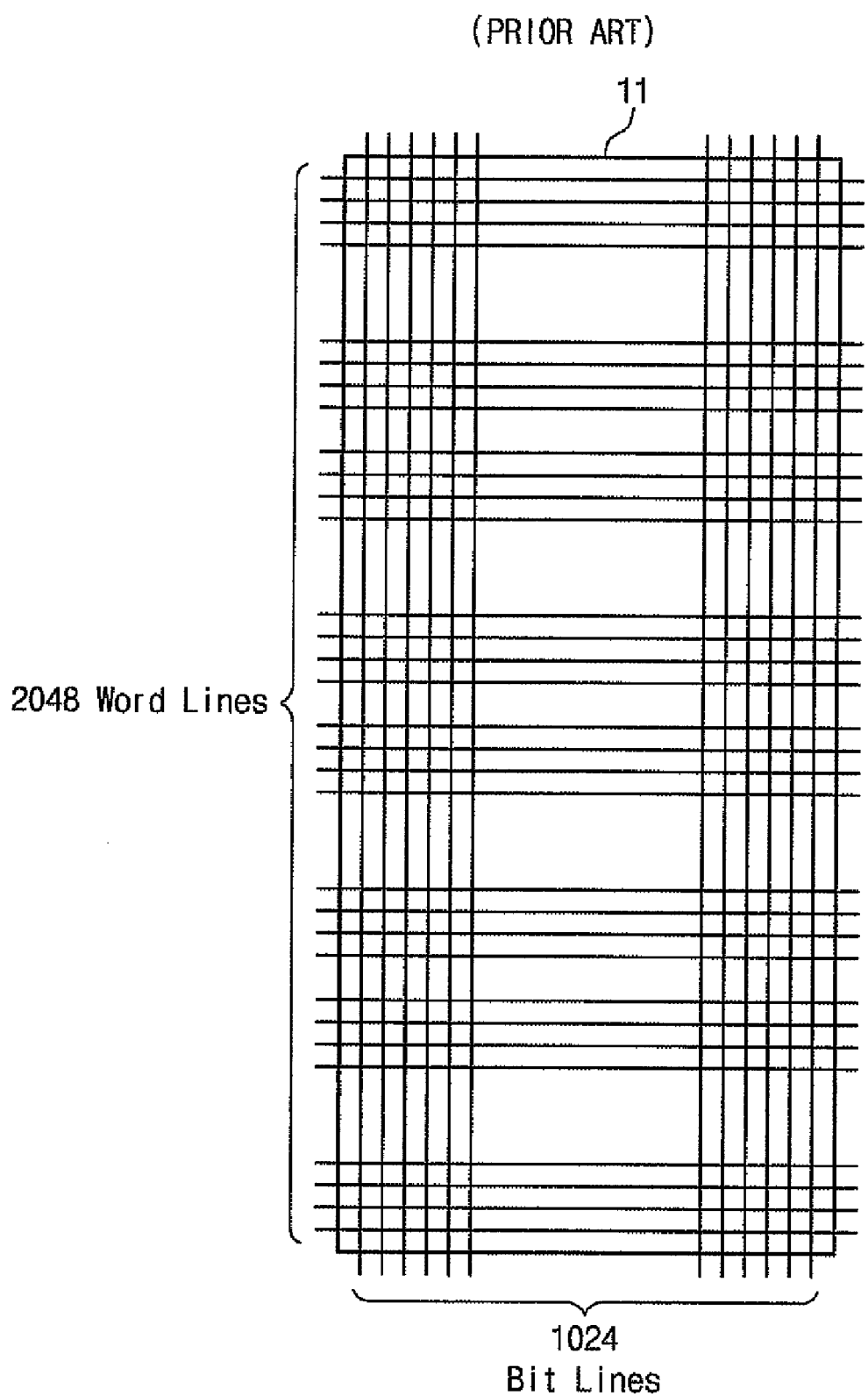
FIG. 4 is a plan view illustrating a memory cell array structure of 2 Mbits according to a second method through an SLC technique.
Figure 5:
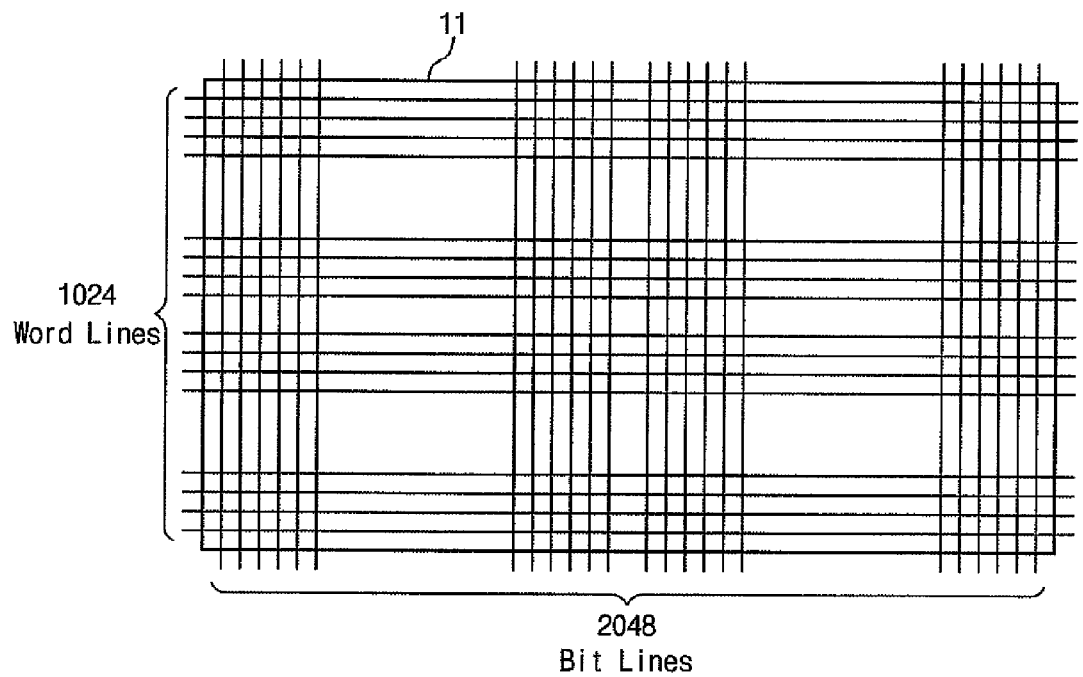
FIG. 5 is a plan view illustrating a memory cell array structure of 2 Mbits according to a third method through an SLC technique.
Figure 6:
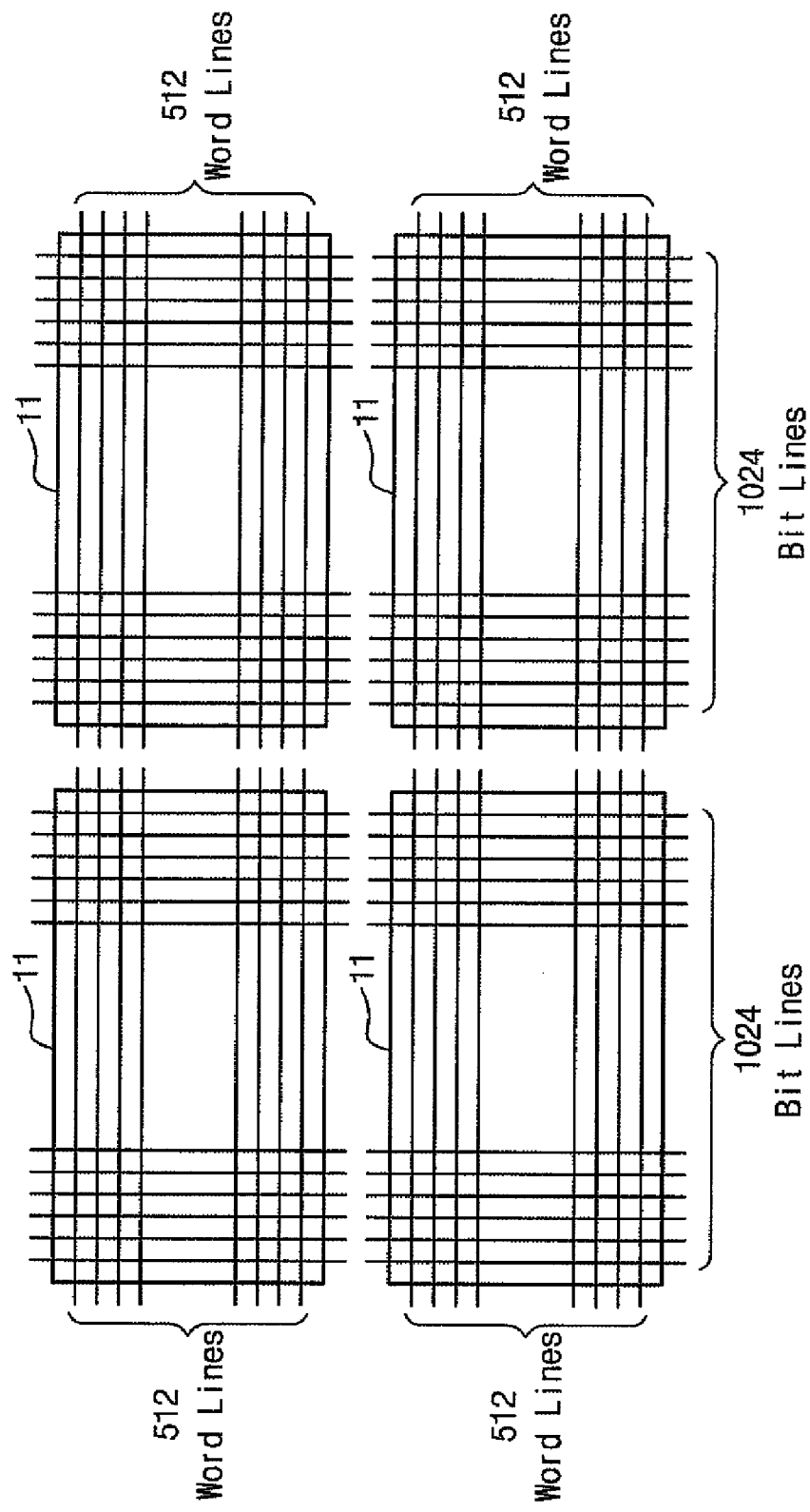
FIG. 6 is a plan view illustrating a memory cell array structure of 2 Mbits according to a fourth method through an SLC technique.

FIG. 1 is used for describing a non-volatile semiconductor memory device according to an embodiment of the present invention and is a plan view illustrating a memory cell array structure of a flash memory. In FIG. 1, a reference number 21 refers to one rectangular P-well region for forming a memory cell array. Reference symbols D1 to D4 refer to a plurality (i.e., four) of dummy word lines. A reference symbol WL1 refers to a first word line group. A reference symbol WL2 refers to a second word line group. A reference number 22 refers to a plurality of bit lines. The four dummy word lines D1 to D4 extend from the center portion in an X-direction of the P-well region 21 toward a Y-direction perpendicular to the X-direction. The first word line group WL1 is formed in the first region 211 in one of the P-well regions 21 at both sides of the dummy word lines D1 to D4, and is disposed parallel to the dummy word lines D1 to D4. The second word line group WL2 is formed in the second region 212 in the other one of the P-well regions 21 at both sides of the dummy word lines D1 to D4, and is disposed parallel to the dummy word lines D1 to D4. The plurality of bit lines 22 are in parallel disposed in the Y-direction of the well region 21 in order to intersect the first and second word line groups WL1 and WL2 and the dummy word lines D1 to D4. Additionally, the plurality of bit line 22 are physically divided in the X-direction of the P-well region 21 at a portion of the dummy word lines D1 to D4 (in more detail, between the inner two dummy word lines D2 and D3). Accordingly, the bit lines 22 intersect the first word line group WL1 at the first region 211 of the P-well region 21 to form a first bit line group BL1. Additionally, the bit lines 22 intersect the second word line group WL2 in the second region 212 of the P-well region 21 to form a second bit line group BL2.

As illustrated in the memory cell structure of FIG. 1, the number of the word lines in the first word line group WL1 is 512. The number of the word lines in the second word line group WL2 is 512. A memory cell (not shown) is connected to each intersection point of the bit lines and the word lines (including the dummy lines. In the memory cell array structure of FIG. 1, the P-well region 21 is shared and the bit line 22 is physically divided at the dummy word lines D1 to D4 in order to constitute a memory cell array of 2 Mbits. In the memory cell array structure of FIG. 1, about 0 V is applied to the dummy word lines D1 to D4 during reading and write operations. Additionally, it is possible to apply a negative voltage in order for memory cells in the dummy word lines D1 to D4 not to have disturbance. During an erase operation, the same negative voltage as the first and second word line groups WL1 and WL2 is applied to the outer dummy word lines D1 and D1. Thus, due to this, it is possible to prevent a deterioration phenomenon of an erasing characteristic of a memory cell. That is, according to the deterioration phenomenon, it is difficult to apply a negative voltage to the first and second word line groups WL1 and WL2 adjacent to the dummy word lines DL1 to DL4 and to which memory cells to be actually erased are connected. A positive voltage is applied to the inner dummy word lines D2 and D3 in order for memory cells in the dummy word lines D2 and D3 not to be erased. In general, the same voltage as the P-well region 21 in a section may be applied to the dummy word lines D2 and D3.

During a write operation, a bit line selection is performed by a half of an array unit, which is divided at the dummy word lines D1 to D4 based on an address. Since the bit lines 22 are divided at the middle portion where the dummy word lines D1 to D4 are disposed, when a write operation is performed on all memory cells of the bit lines 22, a time needed for each memory cell to receive drain disturb is not different from a typical time.

As mentioned above, if the memory cell array structure of FIG. 1 is used, it is possible for a memory cell during a write operation to have the same time needed for receiving drain disturb as before while increasing a sector capacity. Additionally, a space required when the dummy word lines D1 to D4 are disposed is less than a space required when the P-well region 21 is divided. Therefore, it is advantageous in terms of a layout compared to a case where four sectors are used.

Additionally, when the memory cell array structure of FIG. 1 is used, it is possible to provide a device capable of reducing the size of a sector capacity into a half while maintaining a chip capacity.

At this point, if a signal for setting a half of a sector capacity is delivered, a voltage applying method during an erase operation is changed. Its specific description is as follows.

First, if a sector capacity is used as it is (e.g., a total of 2 Mbits), a voltage applying method does not change.

Second, if a sector capacity is set to be a half (e.g., 1 Mbits), let's assume that the first region 211 of FIG. 1 is erased. Since the P-well region 21 is common, a high voltage is applied. A negative voltage is applied to the first word line group WL1 of the first region 211. The same negative voltage as the first word line group WL1 of the first region 211 is applied to the dummy word line D1 adjacent to the first word line group WL1 of the first region 211. A positive voltage is applied to the other dummy word lines D2 to D4 in a certain degree in order not to erase a memory cell in the dummy word lines D2 to D4. In general, the same voltage as the P-well region 21 may be applied. The second word line group WL2 of the second region 212 is set floating or the same voltage as the P-well region 21 is applied to the second word line group WL2. Additionally, it is possible to apply a positive voltage in a certain degree in order for a memory cell of the second region 212 not to receive disturbance.

On the contrary, if the second region 212 is erased, the first region 211 is replaced with the second region 212 and then is applied through the above voltage applying method. Additionally, the dummy word line D1 is replaced with the dummy word line D4 and the dummy word lines D2 to D4 are replaced with the dummy word lines D1 to D3.

Although there is a method for altering a sector capacity through a device using a multi-level cell (MLC), a chip capacity may be changed because a memory cell that originally uses the MLC may use a single level cell (SLC). According to the present invention, provided is a device capable of changing a sector capacity while maintaining a chip capacity.

Figure 7:
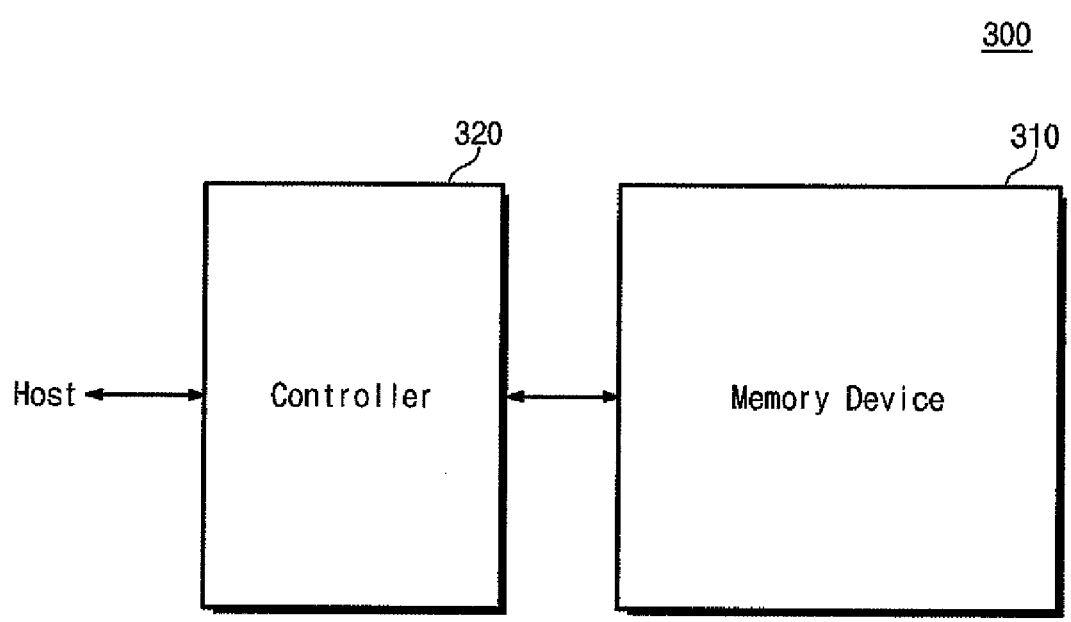
FIG. 7 is a block diagram illustrating a memory system 300 according to an embodiment of the present invention.

FIG. 7 is a block diagram illustrating a memory system 300 according to an embodiment of the present invention. Referring to FIG. 7, the memory system 300 includes a semiconductor memory device 310 and a controller 320.

The controller 320 is connected to a host and the semiconductor memory device 310. The controller 320 delivers data read from the semiconductor memory device 310 into the host, and stores data delivered from the host in the semiconductor memory device 310.

The controller 320 includes well-known components such as RAM, a processing unit, a host interface, and a memory interface. The RAM is used as an operating memory of the processing unit. The processing unit controls general operations of the controller 320. The host interface may include a protocol for data exchange between the host and the controller 320. For example, the controller 320 is configured to communicate with an external (e.g., a host) via one of various interface protocols such as a universal series bus (USB), a multi-media card (MMC), peripheral component interface (PCI)-E, advanced technology attachment (ATA), serial-ATA, parallel-ATA, a small computer system interface (SCSI), an enhanced small disk interface (ESDI), and integrated drive electronics (IDE). The memory interface interfaces with the semiconductor memory device 310. The controller 320 may additionally include an error correction block. The error correction block detects and corrects an error of data read from the semiconductor memory device 310.

The semiconductor memory device 310 includes a memory cell array for storing data, a read/write circuit for writing and reading data into and from the memory cell array, an address decoder for decoding an address from the outside to deliver the decoded address to the read/write circuit, and a control logic for controlling general operations of the semiconductor memory device 310. The memory cell array of the semiconductor memory device 310 will be formed with the structure illustrated in FIG. 1. For example, the semiconductor memory device 310 includes non-volatile memory devices such as SRAM, DRAM, SDRAM, etc. In another example, the semiconductor memory device 310 includes a non-volatile memory device such as ROM, PROM, EPROM, EEPROM, a flash memory device, PRAM, MRAM, RRAM, FRAM, etc.

The controller 320 and the semiconductor memory device 310 may be integrated into one semiconductor device. For example, the controller 320 and the semiconductor memory device 310 are integrated into one semiconductor device to constitute a memory card. For example, the controller 320 and the semiconductor memory device 310 are integrated into one semiconductor device to constitute a memory card such as a PC card (PCMCIA), a compact flash card (CF), a smart media card (SM/SMC), a memory stick, a multimedia card (MMC, RS-MMC, and MMCmicro), a SD card (SD, miniSD, and microSD), and a universal flash memory device (UFS).

In another example, the controller 320 and the semiconductor memory device 310 may be integrated into one semiconductor device to constitute a solid state disk/drive (SSD). If the memory system 300 is used as the SSD, an operating speed of the host connected to the memory system 300 will be drastically increased.

In another example, the memory system 300 may be applied to a personal digital assistant (PDA), a portable computer, a web tablet, a wireless phone, a mobile phone, a digital music player, or devices transmitting and receiving information via a wireless environment.

In another embodiment, the semiconductor memory device 310 and/or the memory system 300 according to the present invention may be packaged using various types of packages. Examples of the packages include package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flat-pack (TQFP), system in package (SIP), multi chip package (MCP), wafer-level fabricated package (WFP), wafer-level processed stack package (WSP), etc.

Figure 8:
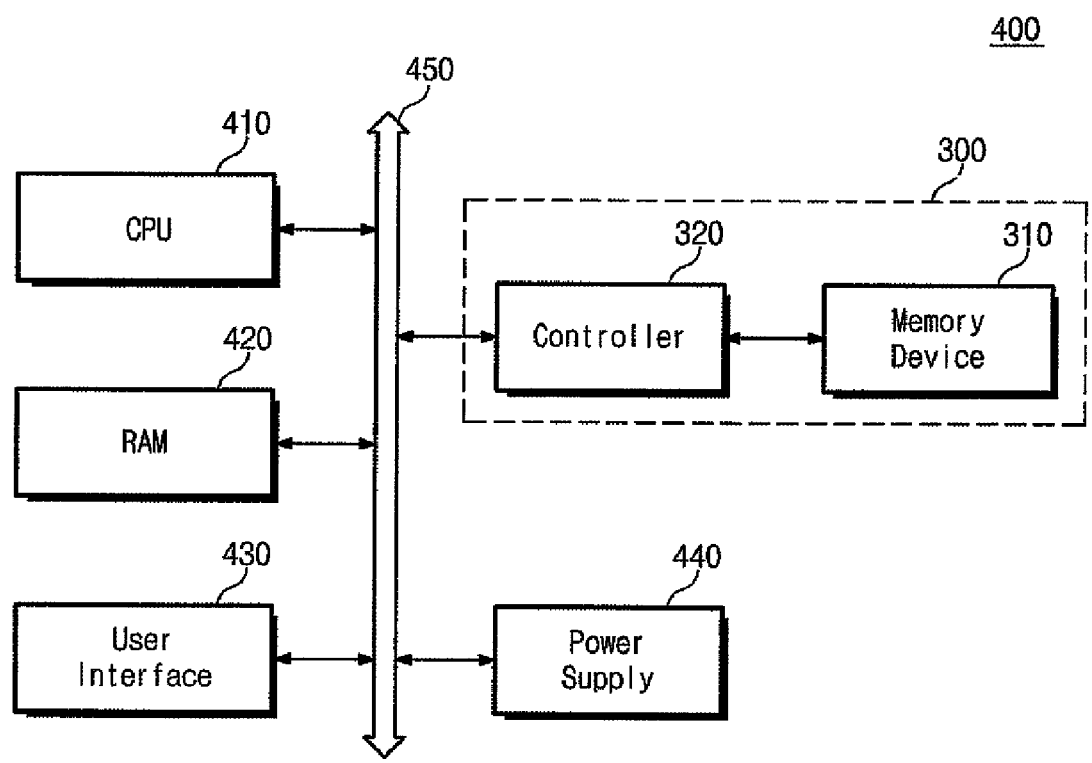
FIG. 8 is a block diagram illustrating a computing system with the memory system of FIG. 7.

FIG. 8 is a block diagram illustrating a computing system 400 with the memory system 300 of FIG. 7. Referring to FIG. 8, the computing system 400 includes a central processing unit (CPU) 410, a RAM 420, a user interface 430, a power 440, and a memory system 300.

The memory system 300 is electrically connected to the CPU 410, the RAM 420, the user interface 430, and the power 440 through a system bus. Data provided through the user interface 430 or processed by the CPU 410 are stored in the memory system 300. The memory system 300 includes the controller 320 and the semiconductor memory device 310.

If the memory system 300 is mounted as the SSD, a booting speed of the computing system 400 will be drastically increased. Although not illustrated in FIG. 8, it is apparent to those skilled in the art that an application chipset, a camera image processor (CIS), a mobile DRAM may be further provided to the computing system 400 according to the present invention.

According to the non-volatile semiconductor memory device of the present invention, a well region is shared, a dummy word line is formed at one direction middle portion of the well region, and bit lines are divided at a dummy word line portion. Accordingly, a time for receiving drain disturb is identical to that of a typical method, and moreover, a memory cell array structure, which is not disadvantageous in terms of a layout, is provided. Moreover, as an additional effect, a non-volatile semiconductor memory device, which can alter a sector capacity while maintaining a chip size, is provided.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A non-volatile semiconductor memory device comprising:
    first and second word line groups disposed in parallel;
    dummy word lines disposed between the first and second word line groups;
    a first bit line group intersecting the first word line group; and
    a second bit line group intersecting the second word line group,
    wherein the first and second word line groups, the first and second bit line groups, and the dummy word lines are disposed on a same well, and
    wherein, during an erase operation, the same voltage applied to the first and second word line groups is applied to dummy word lines adjacent to the first and second word line groups among the dummy word lines.

2. The non-volatile semiconductor memory device of claim 1, wherein the dummy word lines are disposed between the first and second bit line groups.

3. The non-volatile semiconductor memory device of claim 1, wherein, during an erase operation, dummy word lines disposed to have predetermined distance from the first and second word line groups among the dummy word lines are biased so that memory cells connected to the dummy word lines disposed to have predetermined distance from the first and second word line groups are not to be erased.

4. The non-volatile semiconductor memory device of claim 1, wherein memory cells connected to the first and second word line groups and the first and second bit line groups are able to constitute one erase sector.

5. The non-volatile semiconductor memory device of claim 1, wherein memory cells connected to the first word line group and the first bit line group are able to constitute one erase sector, and memory cells connected to the second word line group and the second bit line group are able to constitute another erase sector.

6. A memory system comprising:
    the non-volatile semiconductor memory device of claim 1; and
    a controller controlling the non-volatile semiconductor memory device.

7. A non-volatile semiconductor memory device comprising:
    one well region used for forming a memory cell array;
    a plurality of dummy word lines disposed at a middle portion in one direction of the well region;
    a first word line group disposed at a first region in one direction side among the well regions at both sides of the dummy word lines;
    a second word line group disposed at a second region in the other side among the well regions at both sides of the dummy word lines; and
    a plurality of bit lines intersecting the first and second word line groups and the dummy word lines,
    wherein:
    the bit lines intersect the first word line group in the first region of the well region to constitute a first bit line group through being divided at a portion of the dummy word lines;
    the bit lines intersect the second word line group in the second region of the well region to constitute a second bit line group through being divided at a portion of the dummy word lines; and
    during an erase operation, the same voltage applied to the first and second word line groups is applied to dummy word lines adjacent to the first and second word line groups among the dummy word lines.

8. The non-volatile semiconductor memory device of claim 7, wherein the number of the dummy word lines is four.

9. The non-volatile semiconductor memory device of claim 1, wherein the erasing operation of the memory cell is performed by using the entire well region as a unit or the first or second region of the well region as a unit.

* * * * *